(12) United States Patent
Kleifgen et al.

(10) Patent No.: US 8,991,803 B2
(45) Date of Patent: Mar. 31, 2015

(54) MOUNTING APPARATUS AND METHOD

(75) Inventors: John Kleifgen, Apple Valley, MN (US);
Chad Samp, Albert Lea, MN (US); Lee Jardine, Owatonna, MN (US); Garret Miller, Owatonna, MN (US)

(73) Assignee: Bosch Automotive Service Solutions LLC, Warren, MI (US)

( * ) Notice: Subject to any disclaimer, the term of this patent is extended or adjusted under 35 U.S.C. 154(b) by 244 days.

(21) Appl. No.: 13/602,820

(22) Filed: Sep. 4, 2012

(65) Prior Publication Data
US 2013/0056611 A1 Mar. 7, 2013

Related U.S. Application Data

(60) Provisional application No. 61/530,656, filed on Sep. 2, 2011.

(51) Int. Cl.
*B23Q 1/00* (2006.01)
*B25B 5/14* (2006.01)
*G01R 31/34* (2006.01)

(52) U.S. Cl.
CPC ............... *B25B 5/14* (2013.01); *G01R 31/343* (2013.01)
USPC ............ 269/47; 269/48.2; 269/53; 269/54.2

(58) Field of Classification Search
USPC ................................. 269/47, 48.2, 53, 54.2
See application file for complete search history.

(56) References Cited

U.S. PATENT DOCUMENTS 7,150,186 B2 * 12/2006 Murphy et al. ............ 73/116.04
7,284,416 B2 * 10/2007 Krampitz et al. .......... 73/116.02
7,300,041 B2 * 11/2007 Opsahl et al. .................. 269/47

* cited by examiner

*Primary Examiner* — Lee D Wilson
*Assistant Examiner* — Shantese McDonald
(74) *Attorney, Agent, or Firm* — Baker & Hostetler LLP

(57) ABSTRACT

A mounting apparatus and method that can be used to secure a component to be tested to a testing device when the mounting holes of the component are offset from each other in one or more axes in relation to the axis of the component to be tested.

20 Claims, 10 Drawing Sheets

MOUNTING APPARATUS AND METHOD

CROSS-REFERENCE TO RELATED APPLICATIONS

This application claims priority to provisional U.S. patent application Ser. No. 61/530,656, entitled "Mounting Apparatus and Method," filed Sep. 2, 2011, the disclosure of which is hereby incorporated by reference in its entirety.

FIELD OF THE INVENTION

The present invention relates generally to the field of mounting apparatus for use in test equipment. More particularly, the present invention relates to the field of mounting apparatus for use in test equipment for diagnosing the operation of automotive parts including alternators and starter motors.

BACKGROUND OF THE INVENTION

In the field of test equipment, it is often necessary to securely hold components in place while operating on the component to be tested. By way of example, in the field of automotive test equipment, it is known to test components, such as alternators and starter motors, by mounting them to a test apparatus and applying electrical or mechanical power to the component to be tested. In mounting the component to be tested to the test equipment, it is also known to utilize the existing mounting brackets and holes to secure the component to the test equipment.

An example of such a prior art device for testing such equipment can be found in U.S. Pat. No. 7,300,041. In the device of this patent, a holding pin can be secured to a turret mounted to the base of the testing equipment to allow alternators having mounting holes oriented parallel to the drive pulley to be secured to the device for testing. In addition, as disclosed in that patent, additional holding pins can be secured to the holding pin mounted to the turret to allow alternators having different arrangements of mounting holes to be secured to the testing device for testing.

As the design of engines has continued to become more compact and sophisticated the size and arrangement of mounting holes on components such as alternators have become more diverse. It is now not only common for alternators to have mounting holes that are oriented perpendicular to the drive pulley but also to have mounting holes that are offset on one or more axis from one another with respect to the axis of the drive pulley. It is now also common to have alternators with smaller diameter mounting holes.

In view of the foregoing, there is a need for mounting apparatus that can be used to secure components having a greater diversity of mounting hole orientations to the testing apparatus. There is also a need for mounting apparatus that can be used with components having a wider range of mounting hole sizes. There is also a need for a mounting apparatus that can be readily reconfigured to be used with a wide range of such components.

SUMMARY OF THE INVENTION

The present invention addresses at least the issues discussed above.

In accordance with one embodiment of the present invention a mounting apparatus is provided having a first holding pin having an offset mechanism for allowing the holding pin to be engaged in a first mounting hole of the component to be tested. The first mounting hole offset from the second mounting hole of the component along a first axis in relation to the rotational axis of the component to be tested. The offset mechanism includes a base for securing the holding pin to a testing device, an offset link rotationally secured to the base at a first position on the offset link and a mounting pin secured to the offset link at a second position on the offset link.

In accordance with another embodiment of the present invention, the mounting apparatus further includes an urging device positioned on the mounting pin to allow the holding pin to secure a component having the first mounting hole offset from the second mounting hole along a second axis in relation to the rotational axis of the component to be tested. In an embodiment of the invention the urging device can be a conical thumb nut positioned along a threaded portion of the mounting pin.

In accordance with another embodiment of the present invention, a method of securing a component to a testing device is provided wherein a first mounting pin is aligned with a first mounting hole of the component to be tested and a second pin is aligned with a second mounting hole of the component to be tested. The second mounting pin is aligned with the second mounting pin by translating the second mounting pin in relation to the first mounting pin to adjust for the lateral distance between the first and second mounting holes and rotating an offset link of the second mounting pin to adjust for the offset of the second mounting hole from the first mounting hole along a first axis in relation to the rotational axis of the component to be tested.

In accordance with another embodiment of the invention, the mounting apparatus can be configured to secure components for testing that have a first and second mounting hole offset from each other along a second axis in relation to the rotational axis of the component to be tested. This reconfiguring can be accomplished by positioning an urging device along the mounting pin shaft to engage the surface adjacent the mounting hole of the device to be tested.

In accordance with another embodiment of the invention, the mounting apparatus is provided having first means for engaging a first mounting hole of a component to be tested and second means for engaging a second mounting hole of the components to be tested via an offset mechanism, wherein the first means for engaging is offset along a first axis from the second means for engaging. The offset mechanism includes means for securing the second means for the second means for engaging to a testing device, means for offset linking rotationally secured to the means for securing at a first position on the means for offset linking and means for mounting secured to the means for offset linking at a second position on the means for offset linking.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the present disclosure in detail, it is to be understood that the present disclosure is not limited in its application to the details of construction and to the arrangements of the components set forth in the following description or illustrated in the drawings. The present disclosure is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present disclosure. It is important, therefore, that the claims be regarded as including such equivalent constructions insofar as they do not depart from the spirit and scope of the present disclosure.

DETAILED DESCRIPTION

Figure 1:
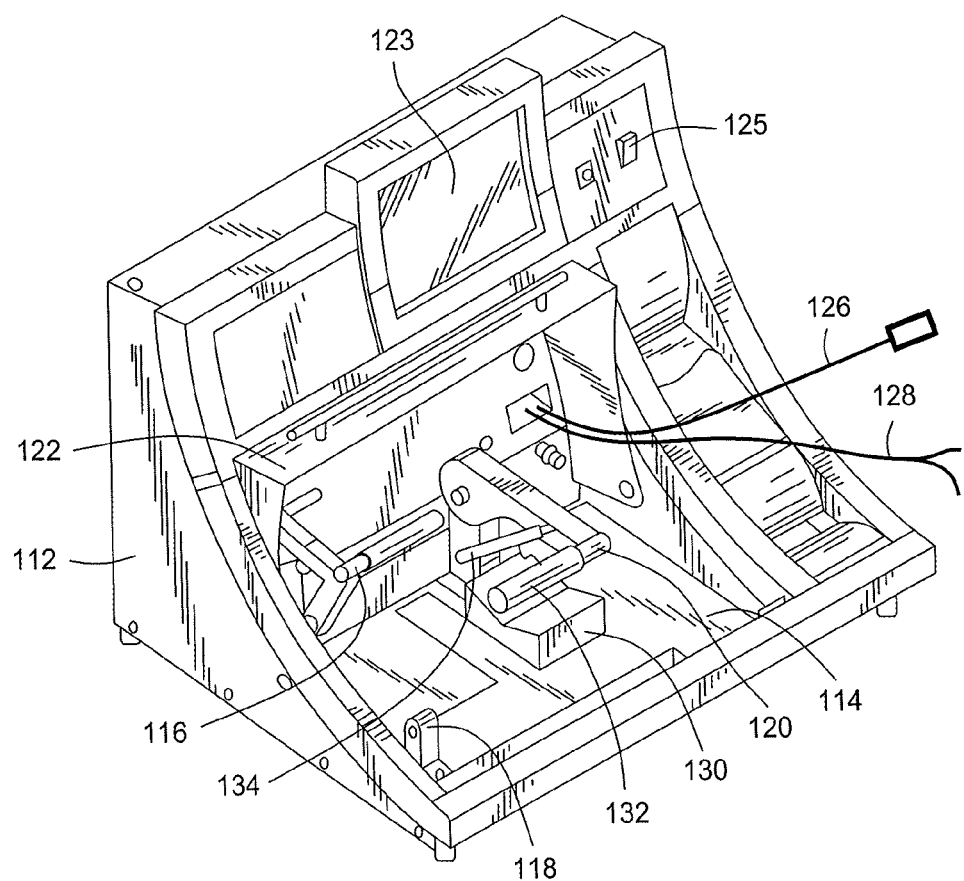
FIG. 1 is a perspective view of an exemplary alternator and starter motor testing apparatus on which the mounting apparatus of the present invention can be used.

The present invention will now be described with reference to the drawing figures, in which like reference numerals refer to like parts throughout. An embodiment in accordance with the present invention provides an alternator and starter motor tester for holding and testing an alternator or starter motor. The alternator and starter motor tester includes a protective hood or cover, a controller communicating with an LCD touch-screen, a barcode connector, USB host and USB function connectors, an Ethernet connector, and a flash memory connector.

Referring now to the figures wherein like reference numbers refer to like elements, FIG. 1 illustrates an alternator and starter motor tester 100 ("tester") including a housing 112 and a base plate (or chassis) 114. The housing 112 surrounds and supports various operative components of the tester 100 including, for example, a power supply, diagnostic electronics, mounting devices, a monitor screen 123, a protective door cover 122, and the like. In one embodiment, the monitor screen 123, e.g., LCD touch-screen, may be disposed within the housing 112. A test power button 125, such as a toggle-switch, is provided on the housing 112 to activate and de-activate test power to the drive motor (not shown) and/or the transformer (not shown). A main power switch (not shown) is also used to provide power to the tester 100.

The tester 100 also includes an alternator belt tensioning arrangement generally designated 116, an alternator mounting arrangement generally designated 118, and a starter motor holder arrangement generally designated as 120. Each of the belt tensioning arrangement 116, the alternator mounting arrangement 118, and the starter motor holder arrangement 120 are mounted directly to the base plate 114. However, in other embodiments, they can be mounted to any part of the housing 112.

The alternator belt tensioning arrangement 116 and the mounting arrangement 118 together hold the alternator in place for testing. An installation assembly that includes one or more mounting pins (not shown) can be placed in the mounting arrangement 118 in order to mount the alternator. The alternator can be horizontally or vertically mounted depending on the type of alternator. The pins are replaceable to allow flexibility for current and future applications and further discussed below.

Also shown in FIG. 1, a test adapter 126 and power leads 128 can be connected to the alternator or starter motor in order to provide test information to tester 100 and power to components being tested. Additionally, a drive belt (not shown), such as a serpentine or V-type belt or the like, can be connected to the alternator and the drive motor to simulate the operating environment in the vehicle. A gas piston may be used for belt tension to ensure consistent belt tension during testing, thereby eliminating over tensioning or belt slippage that may affect test results.

The starter motor holder arrangement 120 includes a quick release ratchet system, wherein the starter is placed on a pad and held in place by the ratchet system. The starter motor holder arrangement 120 includes, a support pad 130, a handle 132 and a release lock 134 that when operated engages and disengages a lock (pawl, for example) from a ratchet (both not shown). The starter motor holder arrangement 120 helps to eliminate the use of straps, and alternatively uses the quick ratchet to hold the starter without the need of any additional holding mechanism or end user assistance during the test. Thus, the aforementioned arrangement makes the loading and unloading of components to be tested much more efficient. The starter motor may be placed on the support pad 130 for testing. Upon the placement, the operator squeezes the release lock and presses down on the handle 132 to engage the starter motor and then releases the lock so that the lock is again reengaged. The starter motor may be powered by a transformer (not shown) in order to simulate operating environments. The transformer may be powered by an external power source and may provide test power to the starter motor via a heavy duty cable and clamps. Power leads 128, including, for example, battery lead, ground lead, solenoid lead and sense lead are connected to the starter motor in order to conduct the tests.

FIG. 1 also illustrates the monitor screen 123 that can operate as a touch-screen LCD user interface that communicates with a controller (discussed below) as well as to display information to the end user. The present invention also utilizes an on-line tutorial for quickly training new personnel on the unit's functionality and on-line help screens to help new users navigate and test components during a test. The monitor screen 123 may offer step-by-step instructions for setting up the tester 100 and conducting tests. The monitor screen 123 may also display on-screen hook up diagrams and a specification library database, which eliminate the need for paper flipcharts and enables software updates for new alternator applications or starter configurations. This database can be updated by compact flash, flash drive, other memory media or remotely via a network connection (discussed below). The monitor screen 123 may allow end users to run advertising screens when the tester is not in use. These screens can be uploaded to the tester 100 from an end user's network server or uploaded from a compact flash or other memory media. Additionally, the monitor screen 123 may be capable of displaying information in various updatable languages.

The tester 100 may output "Good/Bad" or "Pass/Fail" results to the end user. An end user printout that details test results and provides technical advice for other potential problems can be provided to the end user.

Figure 2:
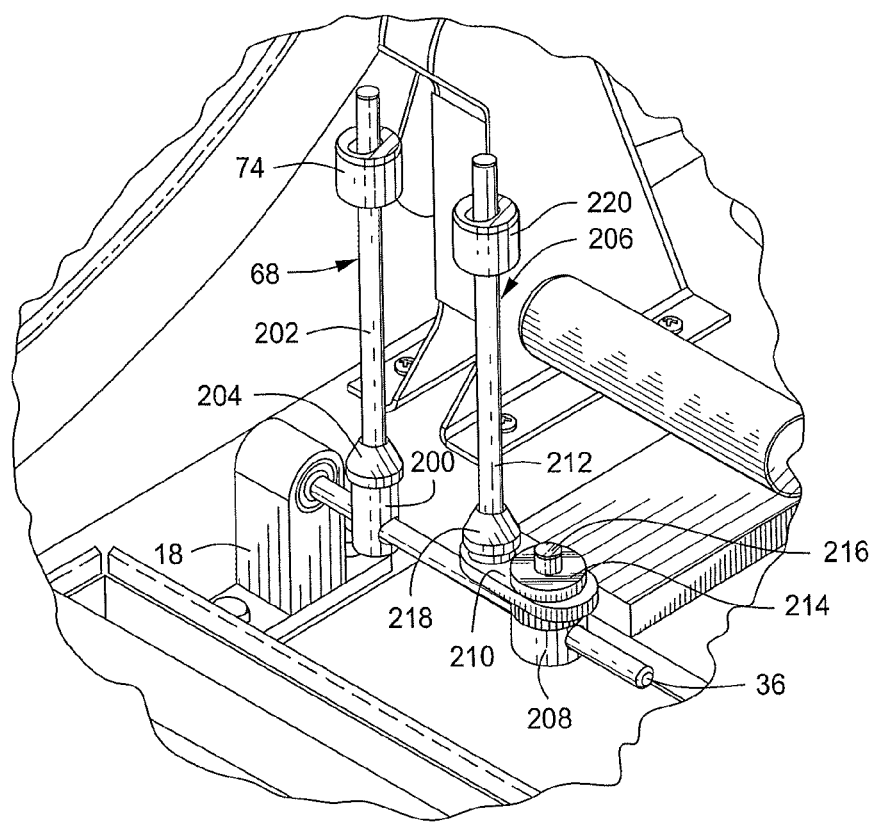
FIG. 2 is a perspective view of an exemplary embodiment of the mounting apparatus of the present invention as attached to the alternator and starter motor testing apparatus of FIG. 1 and having the holding pins depicted in a vertical orientation.

As depicted in FIG. 1, the mounting arrangement 118 is secured to the base of the tester 100. As depicted in FIG. 2, an embodiment of a holding pin 36 is releasably secured to the mounting arrangement 118. A holding pin 68 is moveably secured on the holding pin 36 by passing holding pin 36 through a hole in the base 200 of the holding pin 68. Exemplary mechanisms for securing the holding pin 36 to the mounting arrangement 118 and securing holding pin 68 to holding pin 36 are described in U.S. Pat. No. 7,300,041, the disclosure of which is incorporated herein by reference.

The shaft 202 of the holding pin 68 is threaded along its length to permit the position of a conical nut 204 along the length of the holding pin to be adjusted. A speed nut 74 can also be positioned along the length of the holding pin 68. It will be readily understood that a device to be tested can be secured on the holding pin 68 by adjusting the conical nut 204 to abut against the surface adjacent one side of the mounting hole of the device to be tested and adjusting the speed nut 74 to abut against the surface adjacent the other side of the mounting hole of the device to be tested. The last thread of the holding pin 68 furthest from the base 200 can be punched to prevent the conical nut 204 from being removed.

A second holding pin 206 of an embodiment of the invention is depicted in FIG. 2. The second holding pin 206 has a base 208 which is also moveably secured along the holding pin 36. As will be readily recognized, the base 200 and base 208 can be moved laterally along the length of the holding pin 36 to adjust for different distances between mounting holes on the devices to be tested and to permit the lateral alignment of a device to be tested in relation to the tester 100. Such lateral alignment is necessary, for example, to permit the drive pulley of an alternator to be aligned with the drive belt of the tester 100.

An offset link or articulating arm 210 is rotationally secured at one end to the base 208 using a spring pin (not shown) and the pointed projections 226 (FIG. 7) of the base 208. A mounting pin 212 is releasably attached to the other end of the offset link 210. In an embodiment of the invention, the mounting pin 212 has a pin 221 (FIG. 5) that is releasably secured to the offset link 210 by a thumb nut 211 (FIG. 4) in the offset link 210. By releasably securing the mounting pin 212 to the offset link 210 an assortment of mounting pins can be used to account for, e.g., different mounting hole sizes. In an embodiment of the invention, a mounting pin 212 having a diameter of around 8 millimeters is provided.

A conical nut 218 and speed nut 220 can also be provided on the mounting pin 212. The use and operation of the conical nut 218 and speed nut 220 would be the same as the use and operation of the conical nut 204 and speed nut 74 described above. The last thread of the mounting pin 212 furthest from the offset link 210 can be punched to prevent the conical nut 218 from being removed.

A thumb nut 214 is provided on a threaded shaft 216 that is secured to the base 208 in order to lock the offset link 210 in a selected position. The last thread of the threaded shaft 216 that is furthest from the base 208 can be punched to prevent the thumb nut 214 from being removed.

Figure 6:
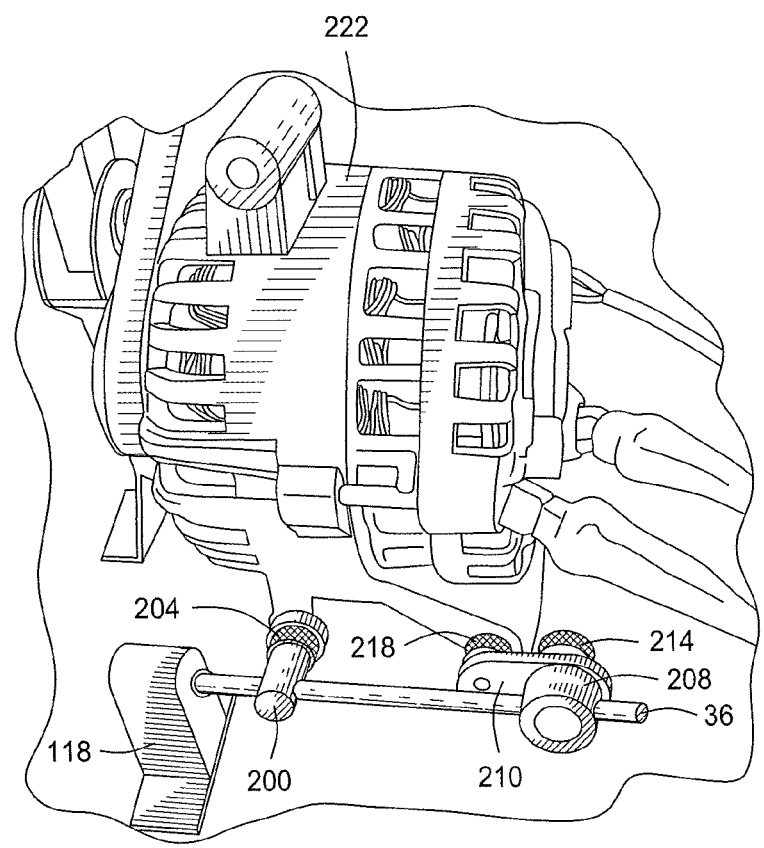
FIG. 6 is a perspective view of an alternator installed on the mounting apparatus of FIG. 2.

As depicted in FIG. 2, the holding pin 68 and mounting pin 206 are oriented vertically with respect to the tester 100. In addition, the offset link is oriented to that the mounting pin 206 is not offset from the holding pin in relation to the axis of the holding pin 36. It is noted that, in operation, the axis of the holding pin 36 is parallel to the axis of component to be tested which, in this embodiment, is an alternator, as shown in FIG. 6.

Figure 3:
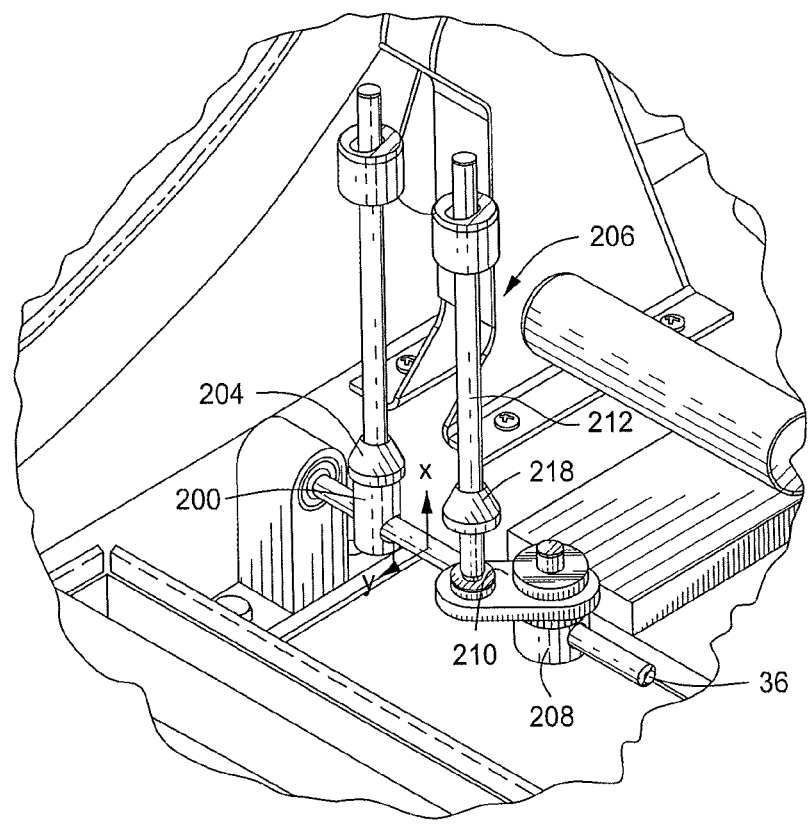
FIG. 3 is a perspective view of the mounting apparatus of FIG. 2 with the articulating arm of one holding pin rotated 45° to offset one holding pin from the other.

In FIG. 3 the mounting apparatus of FIG. 2 is shown with the conical nut 218 moved laterally along the mounting pin 212 away from the offset link 210. In this arrangement, a component to be tested having one mounting hole offset from a second mounting hole along a first axis in relation to the axis of the device to be tested can be secured with the mounting apparatus. More specifically, a component to be tested having one of the mounting holes offset from the other along the x axis of the tester 100 (as shown in FIG. 3) can be securely held in place by the mounting apparatus by moving the conical nut 218 to abut against the surface adjacent the mounting hole of the offset mounting hole. It is readily recognized that by adjusting the positioning of conical nut 204 and conical nut 218, components to be tested having mounting holes at different relative positions along the x axis can be securely mounted to the tester 100.

As is also depicted in FIG. 3, the offset link 210 has been rotated through 45°. It is readily understood that components to be tested that have one mounting hole offset from the other along the y axis (as shown in FIG. 3) can be secured to the tester 100. By rotating the offset link 210 through 360° and adjusting the distance between the base 200 of the first holding pin 68 and the base 208 of the second holding pin 206, components to be tested having different orientations of mounting holes in the y axis can be securely mounted to the tester 100.

Figure 4:
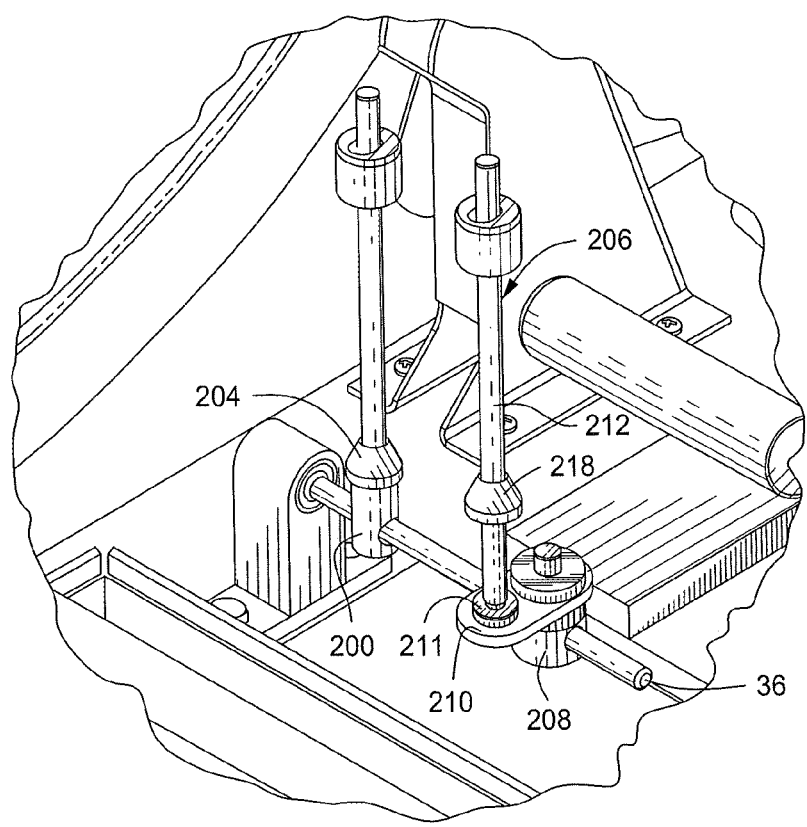
FIG. 4 is a perspective view of the mounting apparatus of FIG. 2 with the articulating arm of one holding pin rotated 90° to offset one holding pin from the other.
Figure 5:
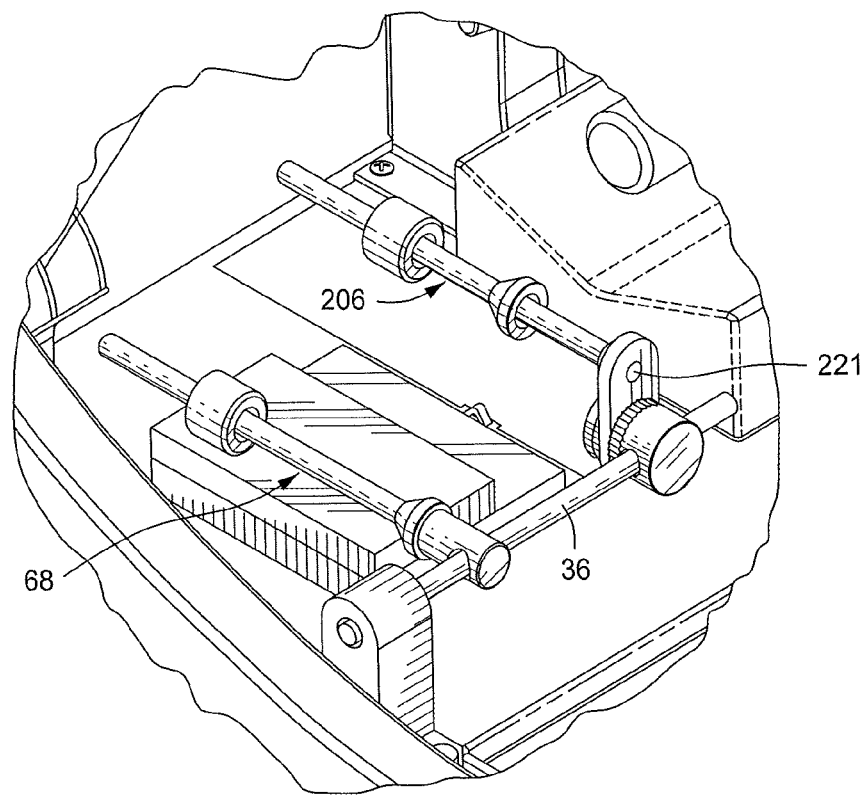
FIG. 5 is a perspective view of the mounting apparatus of FIG. 2 with the holding pins depicted in a horizontal orientation with the articulating arm of one holding pin rotated 90° to offset one holding pin from the other.

It is also readily recognized that, through the adjustment of the conical nuts 204, 218 and the rotation of the offset link 210 through 360°, components to be tested having mounting holes offset from each other in both the x and y axes can be accommodated. In FIG. 4 the mounting apparatus of FIG. 2 is depicted having the offset link 210 rotated through 90°. In FIG. 5 it is shown that it is also possible to rotate the first and second holding pins 68, 206 with respect to the holding pin 36 to also accommodate components to be tested having mounting holes located at various positions around the component.

To better appreciate the use of the mounting apparatus of the present invention, in FIG. 6 an alternator 222 is depicted as mounted to the mounting apparatus. As shown, the conical nuts 204, 218 and thumb nut 214 are knurled to facilitate manual rotation.

Figure 7:
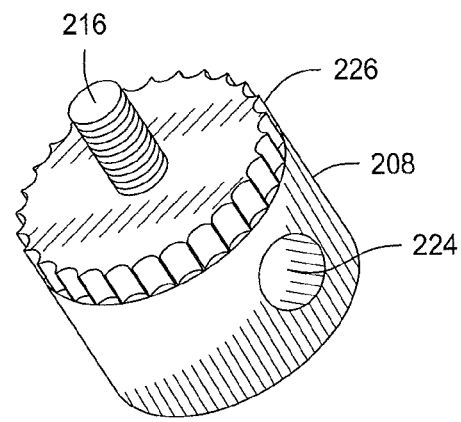
FIG. 7 is a perspective view of the base of a holding pin of the mounting apparatus of FIG. 2.

To better appreciate the mechanism for rotating and locking the offset link 210 of the embodiment shown in FIGS. 2-6, in FIG. 7 there is shown a more detailed drawing of the base 208 of holding pin 206. The base 308 has a channel 224 for sliding over the holding pin 36 and a threaded rod 216 that is affixed to the base. The rim of the base 208 at the interface with the offset link 210 is machined to created pointed projections 226.

Figure 8:
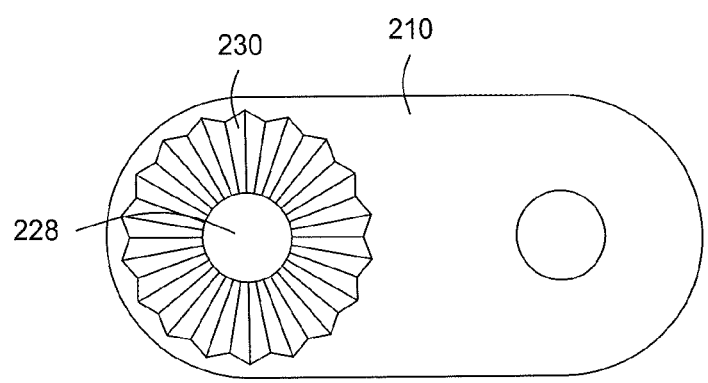
FIG. 8 is a plan view of the articulating arm of a holding pin of the mounting apparatus of FIG. 2.

As depicted in FIG. 8, the offset link 210 is also machined around the hole 228 for receiving the threaded rod 216 of the base 208 to create a pattern of radiating channels 230. When the threaded rod 216 of the base 208 is inserted into the hole 228 of the offset link 210, the pointed projections 226 of the base 208 are engaged in the radiating channels 230 of the offset link 210. Pressure applied by the thumb nut 214 (FIG. 2) locks the offset link 210 to the base 208 in a desired position. It is readily recognized that, through this machining of the rim of the base 226 and offset link 210, indexing of the rotational position of the offset link is accomplished. It is also readily understood that different degrees of indexing can be achieved by varying the pattern of the machining of the base 208 and offset link 210. Alternative mechanisms for achieving the indexing and locking the offset link 210 to the base 208 would be readily apparent to those of ordinary skill in the art and are intended to be covered by this application.

Figure 9:
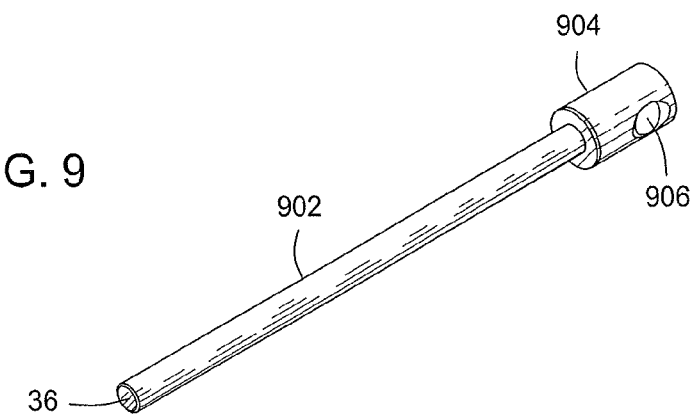
FIG. 9 is a perspective view of a holding pin of the mounting apparatus of FIG. 2.

As depicted in FIG. 9, the holding pin 36 may include a threaded rod 902 engaged with a pin vertical mounting portion 904 having a hole 906. The pin vertical mounting portion 904 of the holding pin 36 is releasably secured to the mounting arrangement 118.

Figure 10:
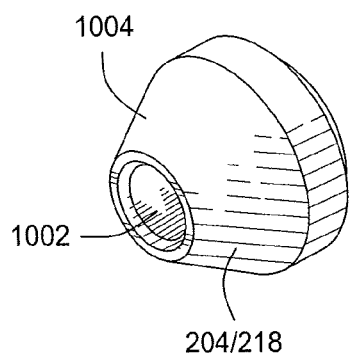
FIG. 10 is a perspective view of a conical nut of the mounting apparatus of FIG. 2.

As depicted in FIG. 10, the conical nut 204 or 208 may include a hole 1002 and a slanted surface 1004. The slanted surface 1004 of the conical nut 204 may have an angle less than 45° degrees with respect to the center axis of the conical nut 204. In an exemplary embodiment, the slanted surface 1004 of the conical nut 204 may have an angle between 25° degrees and 35° degrees with respect to the center axis of the conical nut 204.

Figure 11:
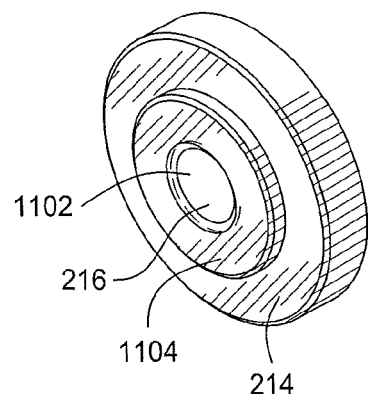
FIG. 11 is a perspective view of a thumb nut of the mounting apparatus of FIG. 2.

As depicted in FIG. 11, the thumb nut 214 may include a center hole 1102, a portion 1104 protruding from a base portion 1106. The protruding portion 1104 may have a smaller diameter than the base portion 1106.

Figure 12:
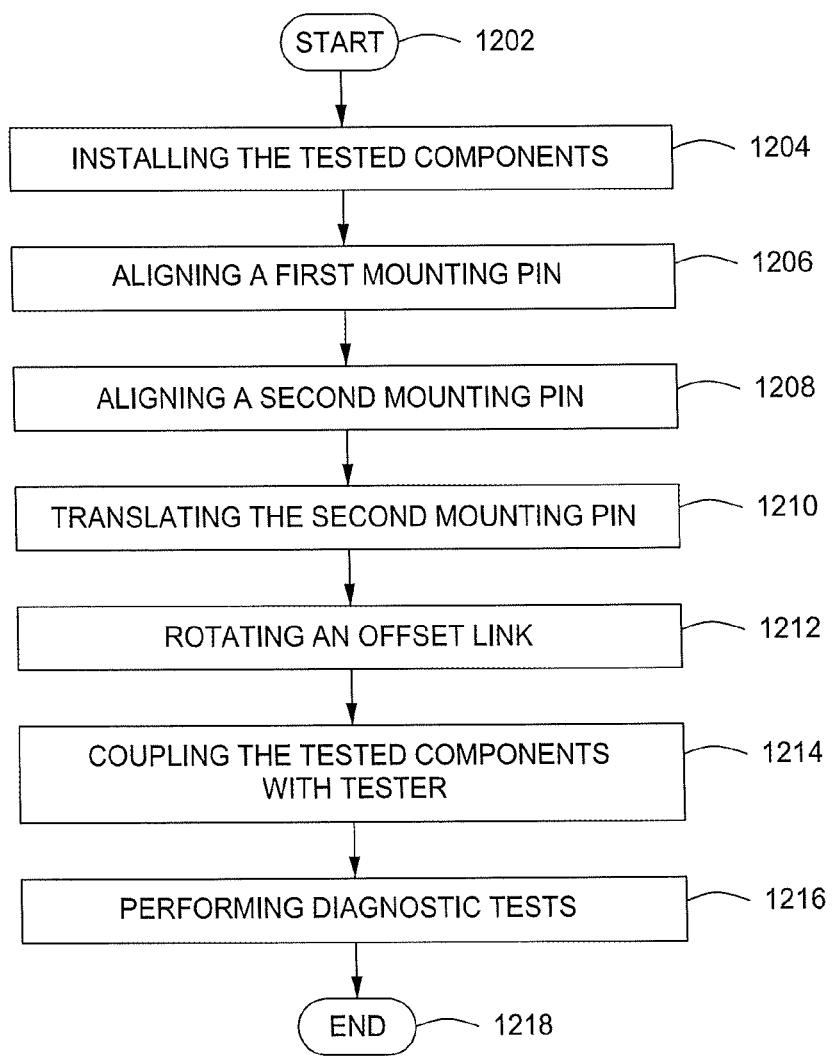
FIG. 12 is a flow diagram of testing a component using the mounting apparatus of FIG. 2.

FIG. 12 is a flow diagram illustrating the functionality for the mounting apparatus as shown in FIG. 2 according to a particular embodiment. This exemplary method 1200 may be provided by way of example, as there are a variety of ways to carry out the method. The method 1200 shown in FIG. 12 can be executed or otherwise performed by one or a combination of various systems. The method 1200 is described below may be carried out by the apparatus and components shown in FIGS. 1-11 and 13, by way of example, and various elements of the apparatus are referenced in explaining the example method of FIG. 12. Each block shown in FIG. 12 represents one or more processes or methods carried out in exemplary method 1200. Referring to FIG. 12, exemplary method 1200 may begin at block 1202.

At block 1202, the method 1200 for testing a component using the mounting apparatus may begin.

At block 1204, the test components may be installed in the mounting apparatus shown in FIG. 2. For example, a tested component may be installed into the mounting apparatus as shown in FIG. 6. The test components may be installed according to blocks 1206 to 1212, as discussed below in detail.

At block 1206, the first holding pin 68 may be mounted in a first mounting hole of the tested component. For example, the first holding pin 68 may be aligned with the first mounting hole of the test component and the first holding pin 68 may be inserted into the first mounting hole of the tested component.

At block 1208, the second holding pin 206 may be adjusted and mounted in a second mounting hole of the tested component. For example, the second holding pin 206 may be adjusted to align with the second mounting hole of the test component. The adjustment of the second holding pin 206 is discussed further in detail with respect to blocks 1210 and 1212. The second holding pin 206 may be inserted into the second mounting hole of the tested component.

At block 1210, the second holding pin 206 may be translated in relation to the first holding pin 68 to adjust the lateral distance between the first holding pin 68 and the second holding pin 206. For example, the second holding pin 206 may be slidably adjusted along the holding pin 36 in order to adjust the lateral distance between the first holding pin 68 and the second holding pin 206. Also, a tested component having one of the mounting holes offset from the other along the x axis of the tester 100 (as shown in FIG. 3) can be securely held in place by the mounting apparatus by moving the conical nut 218 to abut against the surface adjacent the mounting hole of the offset mounting hole. It is readily recognized that by adjusting the positioning of conical nut 204 and conical nut 218 components to be tested having mounting holes at different relative positions along the x axis can be securely mounted to the tester 100.

At block 1212, the offset link 210, if needed, may be rotated to adjust for the offset of the second mounting hole from the first mounting hole along a first axis in relation to the rotational axis of the tested component. For example, the conical nuts 204, 218 may be adjusted and the offset link 210 may be rotated through 360°, to accommodate tested components having mounting holes offset from each other in both the x and y axes. In this arrangement, the tested component having one mounting hole offset from a second mounting hole along a first axis in relation to the axis can be secured with the mounting apparatus. Further, it is also possible to rotate the first and second holding pins 68, 206 with respect to the holding pin 36 to also accommodate the tested components having mounting holes located at various positions.

At block 1214, the tested component may be coupled to the tester 100. For example, test adapters 126 and power leads 128 of the tester 100 may be coupled to the tested component.

At block 1216, a diagnostic test may be performed on the tested component. After securely installing the tested component in the mounting apparatus, the tester 100 may perform diagnostic test on the tested component in order to determine whether the tested component is faulty.

At block 1218, the method 1200 for testing a component using the mounting apparatus may end.

Figure 13:
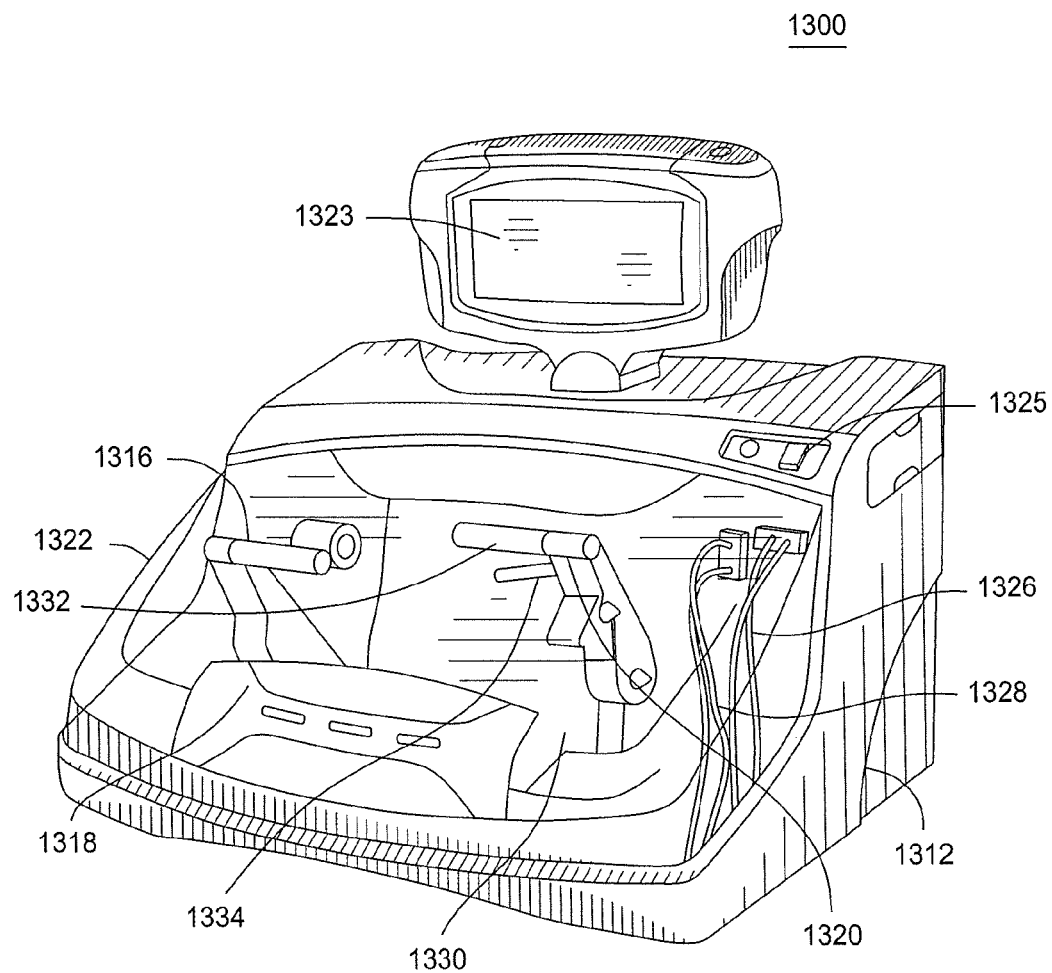
FIG. 13 is a perspective view of another exemplary alternator and starter motor testing apparatus on which the mounting apparatus of the present invention can be used.

Turning now to FIG. 13, a perspective view of another exemplary alternator and starter motor tester 1300 is illustrated. The alternator and starter motor tester 1300 ("tester") has components similar to the tester 100 depicted in FIG. 1, however it has an alternative design. For example, tester 1300 includes a housing 1312 and a base plate (or chassis). The housing 1312 surrounds and supports various operative components of the tester 1300 including, for example, a power supply, diagnostic electronics, mounting devices, a monitor screen 1323, a protective door cover 1322, and the like. In the embodiment depicted, the monitor screen 1323, is an LCD touch-screen disposed within the housing 1312. A power button 1325, such as a toggle-switch design, is provided on the housing 1312 to activate or deactivate test power to the driver motor (not shown) and/or the transformer (not shown). A main power switch (not shown) is also used to provide power to the tester 1300.

The tester 1300 also includes an alternator belt tensioning arrangement generally designated 1316, an alternator mounting arrangement (not shown), and a starter motor holder arrangement generally designated as 1320. Each of the belt tensioning arrangement 1316, the alternator mounting arrangement (not shown), and the starter motor holder arrangement 220 are mounted directly to the base plate.

The test adapters 1326 and power leads 1328 may be connected to the alternator or starter motor in order to provide test information to tester 1300 and power to the component being tested. Additionally, a drive belt (not shown), such as a serpentine or V-type belt or the like, can be connected to the alternator, the motor of the alternator and drive motor to simulate the operating environment in the vehicle. A gas piston may be used for belt tension to ensure consistent belt tension during testing and thereby eliminating over tensioning or slipping belts that may affect test results.

The starter motor holder arrangement 1320 includes a quick release ratchet system, wherein the starter is placed on a pad and held in place by the ratchet system. The starter motor holder arrangement 1320 includes, a support pad (not shown), a handle 1332 and a release lock 1334 that when operated engages and disengages a lock (pawl, for example) from a ratchet (both not shown). The starter motor holder arrangement 1320 helps to eliminate the use of straps, and alternatively uses the quick ratchet to hold the starter without the need of any additional holding mechanism or end user assistance during the test. Thus, the aforementioned arrangement makes the loading and unloading of components to be tested much more efficient. The starter motor may be placed on the support pad (not shown) for testing. Upon the arrangement, the operator squeezes the release lock and presses down on the handle 1332 to engage the starter motor and then releases the lock so that the lock is again reengaged. Power leads 1328, including, for example, battery lead, ground lead, solenoid lead and sense lead are connected to the starter motor in order to conduct the tests.

In the embodiment depicted in FIG. 13, the tester 1300 may incorporate enhanced safety features, such as the protective door cover 1322 to enclose moving parts during tests. The protective door cover 1322 conceals the belt tensioning arrangement 1316, the alternator mounting arrangement (not shown), the starter motor holder arrangement 1320, and other test components, such as an alternator or starter motor. The protective door cover 1322 of the tester 1300 is shown covering at least the belt tensioning arrangement 1316, the alternator mounting arrangement (not shown), and the starter motor holder arrangement 1320 in the closed position.

In the closed position, the protective door cover 1322 reduces the likelihood of the possibility of hands getting caught in moving parts or projectiles potentially contacting the end user. The protective door cover 1322 may employ a door interlock switch (not shown) to disable tests while the protective door cover 1322 is open. Alternatively, the protective door cover 1322 may include a viewing window so that the operator can observe the testing components during the tests.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A mounting apparatus, comprising:
  a first holding pin configured to engage a first mounting hole of a component to be tested; and
  a second holding pin having an offset mechanism for allowing the second holding pin to be engaged in a second mounting hole of the component to be tested, wherein the first holding pin is offset along a first axis from the second holding pin, the offset mechanism comprising;
  a base for securing the second holding pin to a testing device;
  an offset link rotationally secured to the base at a first position on the offset link; and
  a mounting pin secured to the offset link at a second position on the offset link.

2. The mounting apparatus of claim 1, further comprising an urging device positioned on the mounting pin to allow the first holding pin to secure the tested component having the first mounting hole offset from the second mounting hole along a second axis in relation to a rotational axis of the component to be tested.

3. The mounting apparatus of claim 2, wherein the first and second holding pins are threaded along at least a first portion and wherein the urging device is a conical thumb nut.

4. The mounting apparatus of claim 2, wherein said offset mechanism is indexed to allow the offset link to be fixed at a plurality of rotational positions.

5. The mounting apparatus of claim 4, wherein the indexing is accomplished by indentations on the offset link that engage with protrusions on the base.

6. The mounting apparatus of claim 4, wherein the mounting pin is releasably attached to the offset link.

7. The mounting apparatus of claim 6, wherein a thumb nut in the offset link releasably secure the mounting pin to the offset link.

8. The mounting apparatus of claim 6, wherein the mounting pin has a diameter of approximately 8 millimeters.

9. The mounting apparatus of claim 1, wherein the first holding pin has a first mounting pin.

10. The mounting apparatus of claim 9, further comprising an urging device positioned on the first mounting pin to allow a surface adjacent the first mounting hole to be firmly secured against the urging device.

11. The mounting apparatus of claim 10, wherein the first mounting pin has a diameter of approximately 8 millimeters.

12. The mounting apparatus of claim 10, wherein the first and second mounting pins have threaded portions and wherein said mounting apparatus further comprises speed nuts for securing the component to be tested on the first and second mounting pins.

13. The mounting apparatus of claim 1, further comprising a testing device releasably attached to said mounting apparatus.

14. A method of securing a component to a testing device comprising the steps of:
  aligning a first mounting pin with a first mounting hole of the component to be tested; and
  aligning a second mounting pin with a second mounting hole of the component to be tested by:
    translating the second mounting pin in relation to the first mounting pin to adjust for a lateral distance between the first and second mounting holes; and
    rotating an offset link of the second mounting pin to adjust for the offset of the second mounting hole from the first mounting hole along a first axis in relation to the rotational axis of the component to be tested.

15. The method of claim 14, further comprising the step of orienting the first and second mounting pins in relation to the testing device to orient the axis of the component to permit testing.

16. The method of claim 15, further comprising the steps of positioning a first urging device at a position laterally along a length of the second mounting pin to engage a first surface adjacent the second mounting hole.

17. The method of claim 16, further comprising the step of positioning a second urging device at a position laterally along the length of the second mounting pin to engage a second surface adjacent the second mounting hole.

18. The method of claim 17, further comprising the steps of positioning a third urging device at a position laterally along the length of the first mounting pin to engage a first surface adjacent the first mounting hole.

19. The method of claim 18, further comprising the step of positioning a fourth urging device at a position laterally along the length of the first mounting pin to engage a second surface adjacent the first mounting hole.

20. A mounting apparatus, comprising:
- first means for engaging a first mounting hole of a component to be tested; and
- second means for engaging a second mounting hole of the component to be tested via an offset mechanism, wherein the first means for engaging is offset along a first axis from the second means for engaging, the offset mechanism comprising;
- means for securing for the second means for engaging to a testing device;
- means for offset linking rotationally secured to the means for securing at a first position on the means for offset linking; and
- means for mounting secured to the means for offset linking at a second position on the means for offset linking.

* * * * *